United States Patent
Xu et al.

(10) Patent No.: US 12,038,486 B2
(45) Date of Patent: Jul. 16, 2024

(54) INVERTER SYSTEM CAPABLE OF DETECTING OUTPUT GROUND FAULT AND OUTPUT GROUND FAULT DETECTION METHOD USING SAME

(71) Applicant: LS ELECTRIC CO., LTD., Anyang-si (KR)

(72) Inventors: Chengde Xu, Anyang-si (KR); Chun-Suk Yang, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 357 days.

(21) Appl. No.: 17/602,901

(22) PCT Filed: Apr. 7, 2020

(86) PCT No.: PCT/KR2020/004698
§ 371 (c)(1),
(2) Date: Oct. 11, 2021

(87) PCT Pub. No.: WO2020/209577
PCT Pub. Date: Oct. 15, 2020

(65) Prior Publication Data
US 2022/0196757 A1 Jun. 23, 2022

(30) Foreign Application Priority Data
Apr. 11, 2019 (KR) .................. 10-2019-0042512

(51) Int. Cl.
*G01R 31/52* (2020.01)
*G01R 1/20* (2006.01)
(Continued)

(52) U.S. Cl.
CPC ............. *G01R 31/52* (2020.01); *G01R 1/203* (2013.01); *G01R 31/42* (2013.01); *H02H 7/1227* (2013.01)

(58) Field of Classification Search
CPC ........ G01R 31/52; G01R 1/203; G01R 31/42; G01R 19/04; G01R 15/146;
(Continued)

(56) References Cited

U.S. PATENT DOCUMENTS 9,160,161 B2 10/2015 Li et al.
9,983,249 B2 5/2018 Lee et al.
(Continued)

FOREIGN PATENT DOCUMENTS

CN 102288801 A 12/2011
EP 2424064 A1 2/2012
(Continued)

OTHER PUBLICATIONS

International Search Report for related International Application No. PCT/KR2020/004698; report dated Oct. 15, 2020; (5 pages).
(Continued)

*Primary Examiner* — Thienvu V Tran
*Assistant Examiner* — Sreeya Sreevatsa
(74) *Attorney, Agent, or Firm* — K&L Gates LLP

(57) ABSTRACT

The present disclosure relates to an inverter system capable of detecting an output ground fault and an output ground fault detection method using same and, particularly, to an inverter for detecting an output ground fault by detecting the current of a leg-shunt resistor, and an inverter output ground detection fault method using same. The present disclosure compares absolute peak values of 3-phase current AD raw values detected from a shunt resistor, and thus may reliably detect the output ground fault of an inverter.

8 Claims, 9 Drawing Sheets

(51) Int. Cl.
*G01R 31/42* (2006.01)
*H02H 7/122* (2006.01)

(58) Field of Classification Search
CPC .. G01R 31/3277; G01R 31/40; H02H 7/1227;
H02H 3/162; H02M 1/0009; H02M 1/36;
H02M 1/32; H02M 5/458; H02M 7/5387;
H02M 7/5395; H02P 29/024
USPC ....................................................... 361/93.1
See application file for complete search history.

(56) References Cited

U.S. PATENT DOCUMENTS

| | | |
|---|---|---|
| 2005/0099743 A1 | 5/2005 | Lee |
| 2007/0211396 A1* | 9/2007 | Gunji ................... B62D 5/0487 361/31 |
| 2011/0270545 A1 | 11/2011 | Doktar et al. |
| 2012/0050922 A1 | 3/2012 | Tamai et al. |
| 2016/0299184 A1* | 10/2016 | Lee ........................... B60L 3/12 |
| 2019/0305693 A1* | 10/2019 | Lee ......................... H02M 1/32 |

FOREIGN PATENT DOCUMENTS

| | | | |
|---|---|---|---|
| JP | 2005221404 A | * | 8/2005 |
| JP | 2005221404 A | | 8/2005 |
| JP | 2010284078 A | | 12/2010 |
| JP | 2011193584 A | * | 9/2011 |
| KR | 1020050036210 A | | 4/2005 |
| KR | 20150013150 A | | 2/2015 |
| KR | 20160120914 A | | 10/2016 |
| KR | 101790134 B1 | | 10/2017 |

OTHER PUBLICATIONS

Written Opinion for related International Application No. PCT/KR2020/004698; report dated Oct. 15, 2020; (5 pages).
Office Action for related Chinese Application No. 202080027977.6; action dated Feb. 23, 2024; (8 pages).

* cited by examiner

INVERTER SYSTEM CAPABLE OF DETECTING OUTPUT GROUND FAULT AND OUTPUT GROUND FAULT DETECTION METHOD USING SAME

CROSS-REFERENCE TO RELATED APPLICATIONS

This application is the National Stage filing under 35 U.S.C. 371 of International Application No. PCT/KR2020/004698, filed on Apr. 7, 2020, which claims the benefit of earlier filing date and right of priority to Korea utility model Application No. 10-2019-0042512 filed on Apr. 11, 2019, the contents of which are all hereby incorporated by reference herein in their entirety.

FIELD

The present disclosure relates to an inverter system capable of detecting an output ground fault and an output ground fault detection method using the same. More specifically, the present disclosure relates to an inverter that detects an output ground fault based on a detecting result of current of a leg-shunt resistor, and to an inverter output ground fault detection method using the same.

BACKGROUND

An inverter refers to a device that converts DC power into AC power of target frequency and magnitude, and is used to control AC motors. This inverter may be controlled using a variable voltage variable frequency (VVVF) scheme, and may vary voltage and frequency input to the motor based on a pulse width modulation (PWM) output.

The inverter may be damaged by output current abnormality. In this connection, the output current abnormality of the inverter is typically overcurrent and output ground fault. The inverter output ground fault means that at least one-phase of three-phases of inverter output is in contact with earth ground and thus a current path to the earth ground occurs. The inverter output ground fault is caused by disconnection of an inverter output line or a conductor inserted into between the inverter output and the earth. In an event of inverter output ground fault, a motor may be damaged due to deterioration resulting from overcurrent exceeding a rated current. Therefore, a general-purpose inverter that drives the motor notifies a user of presence or absence of the inverter output ground fault in the event of the output ground fault and stops an inverter operation, thereby providing a function to safely protect the motor and the user. However, the output ground fault cannot be accurately detected using a leg-shunt resistor in the general-purpose inverter.

FIG. 4 is a configuration diagram of a general inverter according to a prior art. Further, FIG. 5 is a configuration diagram of an inverter that detects output current using CT according to a prior art. FIG. 6 is a configuration diagram of an inverter that detects output current using a leg-shunt resistor according to a prior art.

Referring to FIG. 4, an inverter 1 according to the prior art receives AC power of three-phases from a power supply (three-phases power) 2. A rectifier 11 rectifies the AC power. Then, a smoothing unit 12 smooths DC voltage received from the rectifier 11 and stores therein the smoothed DC voltage. An inverting unit 13 convert the DC voltage stored in a DC link capacitor as the smoothing unit 12 to AC voltage having a predetermined voltage and frequency, based on a PWM control signal and provides the AC voltage to a motor 3. The inverting unit 13 is composed of three-phases legs, and each leg is composed of two switching elements connected in series with each other.

To protect the inverter from overcurrent, overcurrent detection is required. For such overcurrent detection, a current sensor (current transformer: CT) is disposed on an output A of the inverter 1 to detect inverter output current. Alternatively, as shown in FIG. 6, a leg-shunt resistor connected in series with each of switching elements of a lower leg B of the inverting unit 13 is disposed. Thus, output current of the inverting unit 13 is detected using the resistor and thus the overcurrent is detected. In this connection, generally, instantaneous maximum current of the output current is detected to perform overcurrent protection operation.

Referring to FIG. 6, in the current detection scheme using the leg-shunt resistor, each leg-shunt resistor 20 is connected to an emitter of a lower switching element (e.g., an insulated gate bipolar transistor (IGBT) of each leg of the inverting unit 13 of the inverter 1. Thus, current flowing through each leg-shunt resistor 20 is detected. However, the output current is discontinuously detected according to a switching state of the switching element of the inverting unit 13. Thus, detection of instantaneous maximum current based on the switching state of the switching element is required.

FIG. 7 is a diagram to illustrate a region in which output current detection is impossible based on a PWM state of the inverter.

In the scheme for detecting the output current of the inverter using the leg-shunt resistor, a region where current detection is impossible occurs depending on an operation state of the switching element and a current conducting time. Therefore, in order to extend a region in which current detection is possible, a scheme for detecting currents of valid two-phases among output currents of the three-phases and estimating current of a remaining one-phase based on the detected two currents is used.

Table 1 shows a current detection calculation scheme in the current detection scheme using the leg-shunt resistor.

TABLE 1

| Sector information | Iu | Iv | Iw |
|---|---|---|---|
| 1 | Iu = (Ivs + Iws) | Iv = −Ivs | Iw = −Iws |
| 2 | Iu = −Ius | Iv = (Ius + Iws) | Iw = −Iws |
| 3 | Iu = −Ius | Iv = (Ius + Iws) | Iw = −Iws |
| 4 | Iu = −Ius | Iv = −Ivs | Iw = (Ius + Ivs) |
| 5 | Iu = −Ius | Iv = −Ivs | Iw = (Ius + Ivs) |
| 6 | Iu = (Ivs + Iws) | Iv = −Ivs | Iw = −Iws |

FIG. 8 is a configuration diagram of an inverter that may detect a ground fault of an output according to a prior art. Referring to FIG. 8, the three-phases output currents are detected and an inverter output current is detected by pre-processing the detected three-phases output currents. Further, a controller determines whether an output ground fault occurs, based on a calculation result of the output current input to a controller.

FIG. 9 is a block diagram showing output current paths in a normal state and in an event of an output ground fault in an inverter according to a prior art. In this connection, (a) in FIG. 9 shows the inverter output current path in the normal state and (b) in FIG. 9 shows the inverter output current path in the event of the output ground fault.

Referring to (a) of FIG. 9, in the inverter normal operation, a sum of three output currents input from three current sensors for sensing three-phases currents of the inverter becomes 'Iu+Iv+Iw=0' according to Kirchhoff's current law. However, referring to (b) of FIG. 9, when the output ground fault occurs, a path of a current of a phase having the output ground fault to the earth occurs. Thus, the sum of three output currents input from three current sensors for sensing three-phases currents of the inverter is not zero. The inverter output ground fault detection method may determine that the output ground fault occurs when the sum of the three-phases currents as obtained by the Kirchhoff's current law is greater than or equal to a set level and then performs a protective operation.

However, in the current detection scheme using the leg-shunt resistor as described above, the scheme for detecting the valid two-phases currents among the inverter three-phases output currents based on a PWM period and then calculating the remaining one-phase current based on the detected valid two-phases currents cannot detect the output ground fault. That is, in the conventional current detection scheme using the leg-shunt resistor, the sum of the three-phases output currents as obtained according to the Kirchhoff's current law is always '0' when the inverter output ground fault occurs. Therefore, the conventional ground fault detection scheme cannot detect the output ground fault of the inverter. Thus, the inverter's overcurrent protection operation may not protect the inverter and the user from the overcurrent.

When the inverter output ground fault occurs, a magnitude of the current is related to a ground resistor. When a very small ground resistor is connected to one of the three-phases legs, and the current flows excessively, the inverter's own overcurrent protective operation blocks the inverter's output. However, when a ground resistor is in an output ground fault state, the output ground fault current may be large enough to not perform the overcurrent protective operation of the inverter. Further, an overcurrent protective level increases as a capacity of the inverter increases. Thus, the output ground fault current may not reach the overcurrent protective level. In those cases, even when an output ground fault of one-phase occurs, this fault cannot be detected, so that the protective operation cannot be performed.

SUMMARY

A purpose of the present disclosure is to provide an inverter system capable of detecting an output ground fault in a current detection scheme using a leg-shunt resistor, and an output ground fault detection method using the same.

Purposes of the present disclosure are not limited to the above-mentioned purpose. Other purposes and advantages of the present disclosure that are not mentioned above may be understood based on following descriptions, and will be more clearly understood with reference to embodiments of the present disclosure. Further, it will be readily apparent that the purposes and advantages of the present disclosure may be realized using means and combinations thereof indicated in the Claims.

The present disclosure provides an inverter system capable of detecting an output ground fault, the system comprising: an inverting unit including two switching elements connected in series with each of legs thereof; each leg-shunt resistor connected in series with a switching element of a lower leg of each leg of the inverting unit; and a controller configured to control the inverting unit, wherein the controller is further configured to: compare threes peak values of absolute values of three current values of three-phases detected from three leg-shunt resistors respectively with each other; and detect an output ground fault based on the comparing result.

In one implementation of the system, the controller includes: an output current detection module configured to detect the current values of the three-phases from the three leg-shunt resistors, respectively and detect the peak values of the absolute values thereof; an output current comparing module configured to compare peak values of two phases among the three peak values of the absolute values of the three-phases with each other to generate three difference values; and an output ground fault detection module configured to: when one of the difference values is equal to or greater than an output ground fault level, increment an output ground fault count related to a phase corresponding to said one; and when the incremented count is equal to or greater than an output ground fault reference, determine that an output ground fault has occurred and thus stop an operation of the inverting unit.

In one implementation of the system, the output ground fault detection module is configured to: when each of a UV difference value and a VW difference value is greater than the output ground fault level and a WU difference value is smaller than the output ground fault level, determine that an abnormality has occurred in the V-phase; when the UV difference value is greater than the output ground fault level, the VW difference value is smaller than the output ground fault level, and the WU difference value is greater than the output ground fault level, determine that an abnormality has occurred in the U-phase; and when the UV difference value is smaller than the output ground fault level and each of the VW difference value and the WU difference value is larger than the output ground fault level, determine that an abnormality has occurred in the W-phase.

Further, the present disclosure provides a method for detecting an output ground fault using an inverter system, wherein the inverter system includes: an inverting unit including two switching elements connected in series with each of legs thereof; and each leg-shunt resistor connected in series with a switching element of a lower leg of each leg of the inverting unit; and a controller configured to control the inverting unit, wherein the method comprises: detecting, by the controller, three current values of three-phases from three leg-shunt resistors, respectively; detecting, by the controller, peak values of absolute values of the three current values; comparing, by the controller, peak values of two phases among the three peak values of the absolute values of the three-phases with each other to generate three difference values; when one of the difference values is equal to or greater than an output ground fault level, incrementing, by the controller, an output ground fault count related to a phase corresponding to said one; and when the incremented count is equal to or greater than an output ground fault reference, determining, by the controller, that an output ground fault has occurred and thus stopping, by the controller, an operation of the inverting unit.

In one implementation of the method, the current values of the three-phases include a U-phase current value, a V-phase current value and a W-phase current value, wherein the difference values include: an UV difference value obtained by comparing the peak values of the absolute values of the U-phase current value and the V-phase current value with each other; a VW difference value obtained by comparing the peak values of the absolute values of the V-phase current value and the W-phase current value with each other; and a WU difference value obtained by comparing the peak values of the absolute values of the U-phase current value and the W-phase current value with each other.

In one implementation of the method, the incrementing of the output ground fault count and the determining that the output ground fault has occurred include: when each of the UV difference value and the VW difference value is greater than the output ground fault level and the WU difference value is smaller than the output ground fault level, determining, by the controller, that an abnormality has occurred in the V-phase; when the UV difference value is greater than the output ground fault level, the VW difference value is smaller than the output ground fault level, and the WU difference value is greater than the output ground fault level, determining, by the controller, that an abnormality has occurred in the U-phase; and when the UV difference value is smaller than the output ground fault level and each of the VW difference value and the WU difference value is larger than the output ground fault level, determining, by the controller, that an abnormality has occurred in the W-phase.

Technical Effect

The inverter system capable of detecting the output ground fault according to the present disclosure and the inverter output ground fault detection method using the same may compare the absolute peak values of the current Analog-to-Digital (AD) raw values of the three-phases detected at the leg-shunt resistors with each other and may reliably detect the inverter's output ground fault based on the comparing result.

The above-described effects, and specific effects of the present disclosure as not mentioned above will be described based on specific details for carrying out the disclosure.

DETAILED DESCRIPTION

Figure 1:
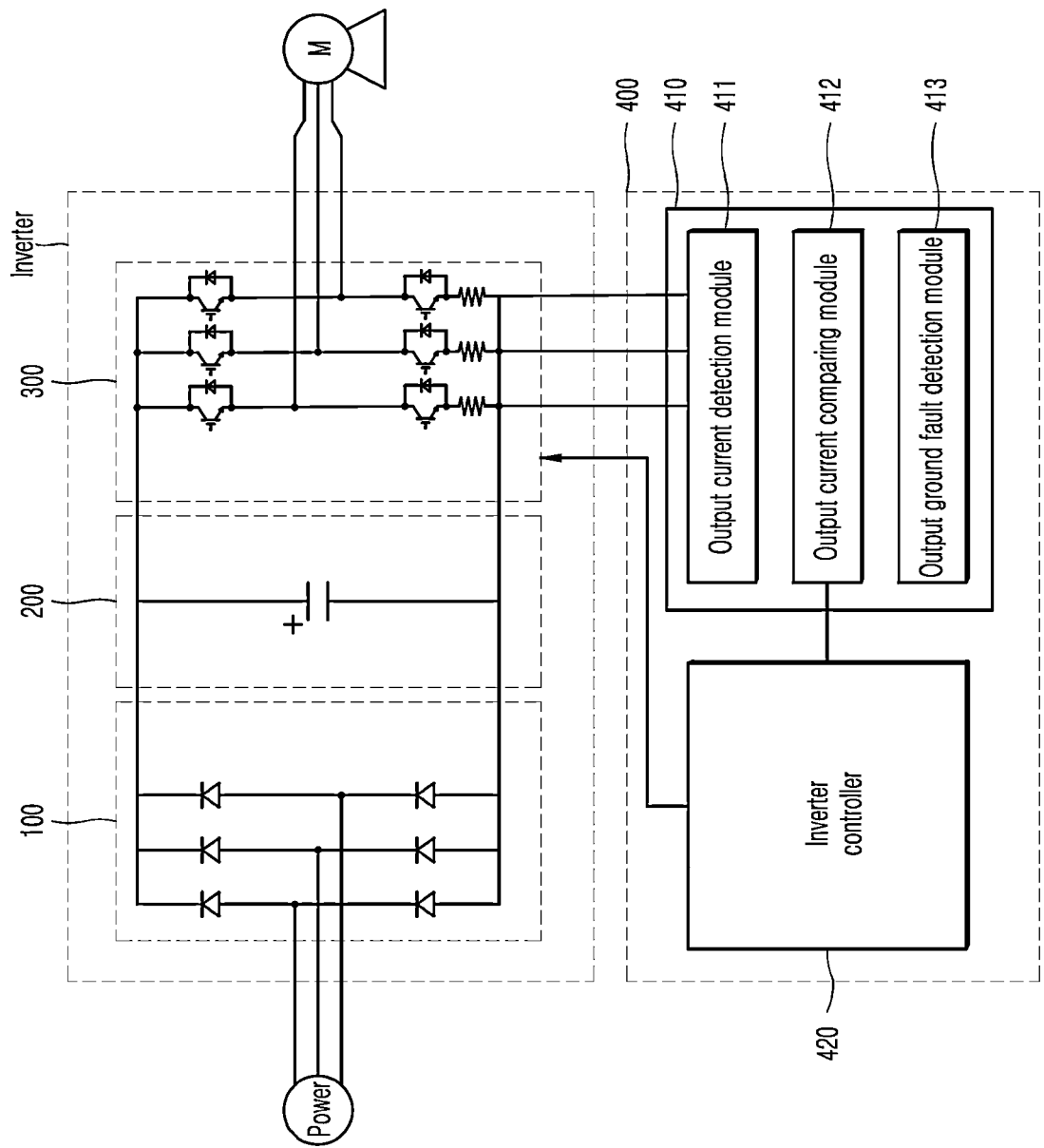
FIG. 1 is a circuit diagram of an inverter system that may detect an output ground fault according to the present disclosure.

The above objects, features and advantages will be described in detail later with reference to the accompanying drawings. Accordingly, a person with ordinary knowledge in the technical field to which the present disclosure belongs will be able to easily implement the technical idea of the present disclosure. In describing the present disclosure, when it is determined that a detailed description of a known component related to the present disclosure may unnecessarily obscure gist the present disclosure, the detailed description is omitted. Hereinafter, a preferred embodiment according to the present disclosure will be described in detail with reference to the accompanying drawings. In the drawings, the same reference numerals are used to indicate the same or similar elements.

Hereinafter, an inverter system capable of detecting an output ground fault according to some embodiments of the present disclosure and an output ground fault detection method using the same will be described.

FIG. 1 is a circuit diagram of an inverter system that may detect an output ground fault according to the present disclosure.

As shown in FIG. 1, the inverter system capable of detecting an output ground fault according to the present disclosure includes a rectifier 100 for rectifying three-phases power, a smoothing unit 200 for smoothing current output from the rectifier 100, an inverting unit 300 which outputs current from the smoothing unit 200 to a motor, based on control from a controller 400, and the controller 400 for detecting an output ground fault based on output currents at the leg-shunt resistors of the inverting unit 300 and controlling the inverting unit 300 based on the detecting result. In this connection, the rectifier 100 performs a rectification function using a diode, and the smoothing unit 200 performs a smoothing function using a condenser.

The inverting unit 300 is composed of three-phases legs, and two switching elements are connected to each leg. Further, the inverting unit 300 receives a PWM input from the controller 400 and outputs the smoothed current from the smoothing unit 200 to the motor, based on the PWM input. Each leg-shunt resistor is connected to a lower switching element of each leg of the inverting unit 300. Thus, the inverting unit 300 may deliver the output current thereof to an output ground fault detector 410 of the controller 400 which will be described later.

The controller 400 detects the output ground fault and controls the PWM input of the inverting unit 300 based on the detection result, thereby controlling the output of the inverting unit 300. For this purpose, the controller 400 includes the output ground fault detector 410 that detects the output ground fault, and an inverter controller 420 that controls the inverting unit 300 based on the detected output ground fault.

The output ground fault detector 410 converts the current AD (Analog-to-Digital) raw values measured from the leg-shunt resistors of the 3 phases into the three absolute values and compare peak values of the three absolute values with each other and detect the output ground fault based on the comparing result. The output ground fault detector 410 include an output current detection module 411 for detecting the current AD raw values from the leg-shunt resistors, an output current comparing module 412 for comparing the peak values of the absolute values of the phases with each other, and an output ground fault detection module 413 for detecting an output ground fault based on a difference value obtained by the output current comparing module 412.

The output current detection module 411 detects the output currents from the leg-shunt resistors, that is, the current AD raw values. In this connection, the current AD raw value refers to an AD current in a raw state before Kirchhoff's Current Law (KCL) is applied to estimate a remaining one-phase current that is not measured by the controller 400 due to overcurrent detection. Further, the output current detection module 411 obtains peak values of current AD raw absolute values (hereinafter, referred to as the peak value of the absolute value) by converting the current AD raw values into the absolute values such that a negative value is inverted to a positive value. In one example, the output current detection module 411 is not provided in the controller 400 and may be implemented as a separate circuit.

The output current comparing module 412 compares the peak values of the absolute values transmitted from the output current detection module 411 with each other. The inverter system according to the present disclosure may measure only the output currents of two-phases from the leg-shunt resistors due to a structure thereof. Therefore, only two among U-phase, V-phase, and W-phase, that is, U-phase and V-phase, V-phase and W-phase, W-phase and U-phase value may be compared with each other to create difference values. In this embodiment, the above-described difference values are defined as a UV difference value, a VW difference value, and a WU difference value, respectively. Thus, the output current comparing module 412 obtains the UV difference value, the VW difference value, and the WU difference value.

The output ground fault detection module 413 compares each of the UV difference value, the VW difference value, and the WU difference value generated from the output current comparing module 412 with an output ground fault level and accumulates an output ground fault count based on the comparing result and then detect the output ground fault based on the accumulation result. More specifically, the output ground fault detection module 413 determines that there is an abnormality in a V-phase among the current AD raw values of the 3 phases when the UV difference value and VW difference value are greater than the output ground fault level and the WU difference value is smaller than the output ground fault level. When UV difference value is larger than output ground fault level, VW difference value is smaller than output ground fault level, and WU difference value is larger than output ground fault level, it is determined that there is an abnormality in the U-phase among the current AD raw values of the 3 phases. Further, when the UV difference value is smaller than the output ground fault level, and the VW difference value and WU difference value are larger than the output ground fault level, it is determined that there is an abnormality in the W-phase among the current AD raw values of the 3 phases. Whenever it is determined that there is the abnormality, the output ground fault detection module 413 increases the output ground fault count. That is, when there is an abnormality in the U-phase, the module 413 increases a U-phase output ground fault count. When there is an abnormality in the V-phase, the module 413 increases the V-phase output ground fault count. When there is an abnormality in the W-phase, the module 413 increases the W-phase the output ground fault count. Further, when at least one of the U-phase output ground fault count, the V-phase output ground fault count, or the W-phase output ground fault count is greater than or equal to an output ground fault reference, the output ground fault detection module 413 determines that an output ground fault has occurred. When the output ground fault detection module 413 determines that the output ground fault has occurred, the module 413 delivers an output ground fault signal to the inverter controller 420.

The inverter controller 420 controls the inverting unit 300 using the PWM input. In this connection, the inverter controller 420 cuts off the PWM signal input to the inverting unit 300 when the output ground fault signal is received from the output ground fault detection module 413, and then prevents the power output from the inverting unit 300 from being delivered to the motor.

Figure 2:
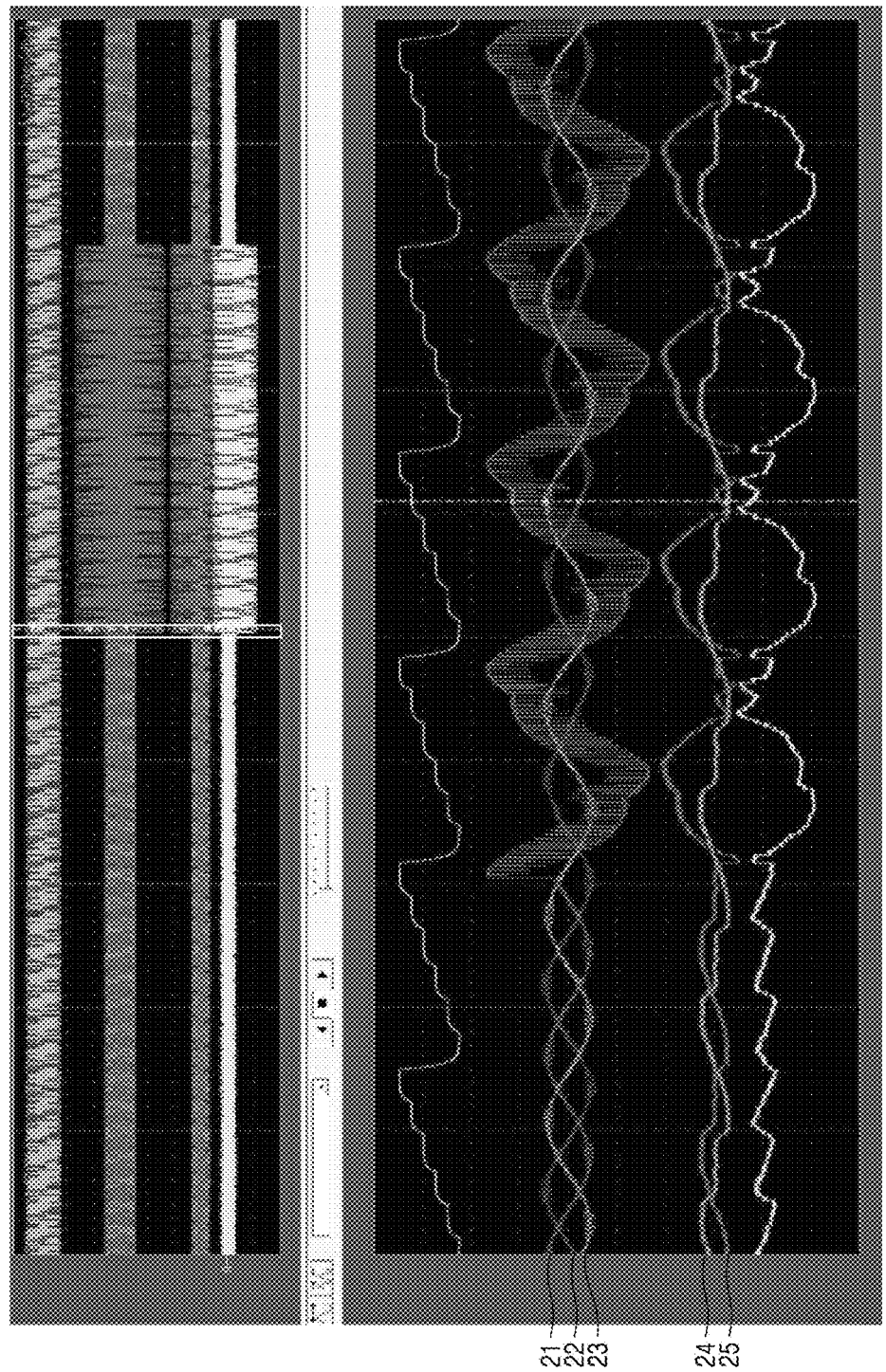
FIG. 2 is a waveform diagram of waveforms of three-phases currents and three-phases currents calculation raw values when an output ground fault occurs in an inverter system that may detect an output ground fault according to the present disclosure.

FIG. 2 is a waveform diagram of waveforms of three-phases currents and three-phases currents calculation raw values when an output ground fault occurs in an inverter system that may detect an output ground fault according to the present disclosure. In FIG. 2, a waveform 21, a waveform 22, and a waveform represent actual output current waveforms of a channel 8 (W-phase), a channel 9 (U-phase), and a channel 10 (V-phase), respectively. A waveform 24 (channel 6) represents a value obtained by the controller calculating an inverted value of a V-phase (waveform 23, channel 10) output current. A waveform 25 (channel 7) represents value obtained by the controller calculating an inverted value of a W-phase (waveform 21, channel 8) output current.

Referring to FIG. 2, it may be identified that in the event of the output ground fault, a large current flows only at a phase having a ground fault. Further, it may be identified that the current AD raw value corresponds to more than a half of a cycle of a shape of the current. That is, within one cycle of an operation period, the peak value of the absolute value of the current AD raw value is maintained at a constant value when the output ground fault does not occur. In the event of the output ground fault, the peak value of the current AD raw value of one phase is larger than each of those of the other two-phases. Therefore, the controller may detect and compare the peak values of the AD raw absolute values of the three phases currents per one cycle of the operation period with each other, and may determine that the output ground fault has occurred when the difference value of one-phase is greater than a certain value (output ground fault level).

As described above, the controller according to the present disclosure may reliably compare the peak values of the absolute values of the current AD raw values of the three-phases detected from the leg-shunt resistors with each other and detect the output ground fault of the inverter based on the comparing result.

Hereinafter, the inverter output ground fault detection method according to the present disclosure will be described with reference to the drawings. Redundant portions of the description of the inverter system capable of detecting the output ground fault according to the present disclosure as described above will be omitted or briefly described.

Figure 3:
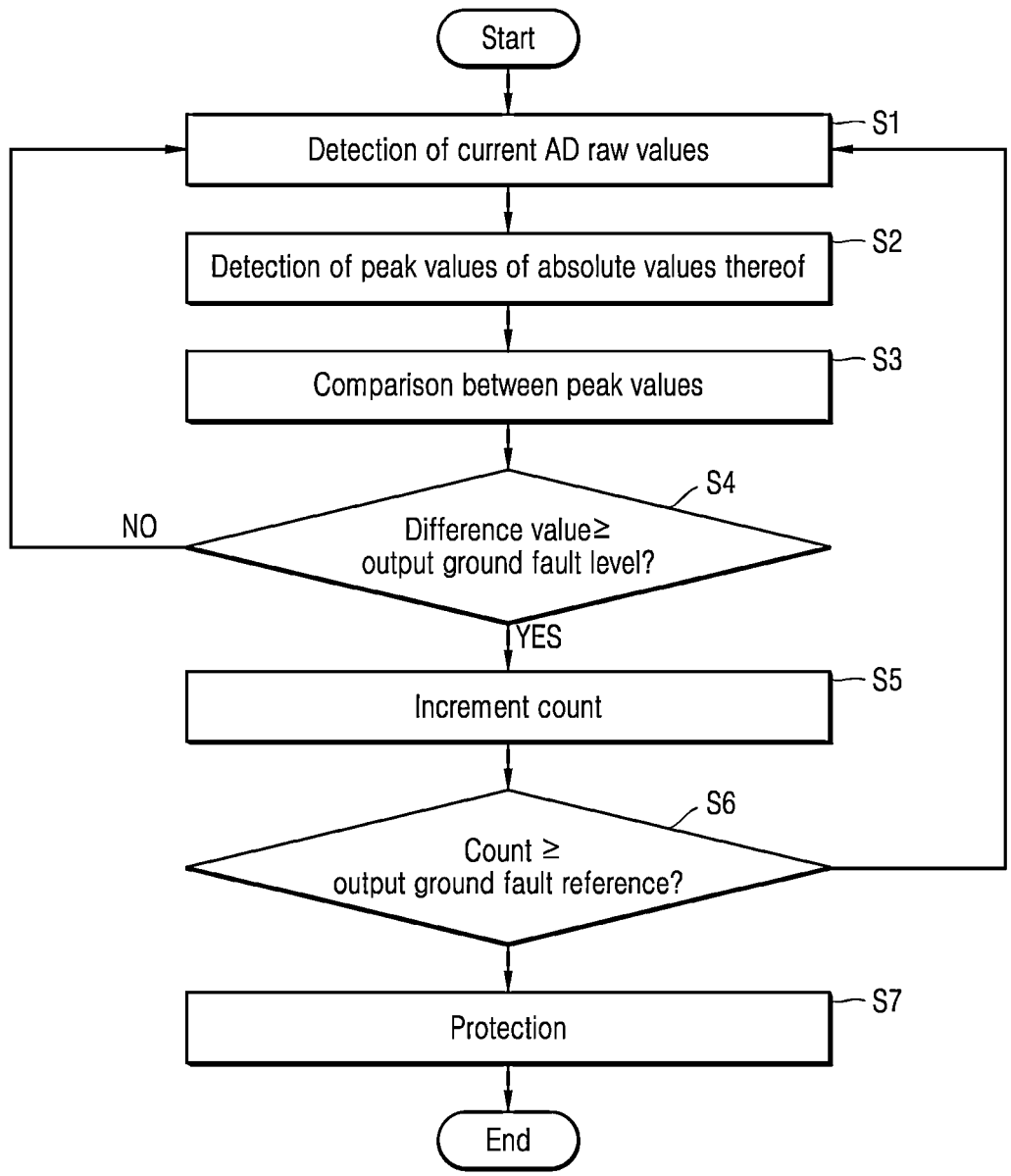
FIG. 3 is a flowchart of an inverter output ground fault detection method according to the present disclosure.
Figure 4:
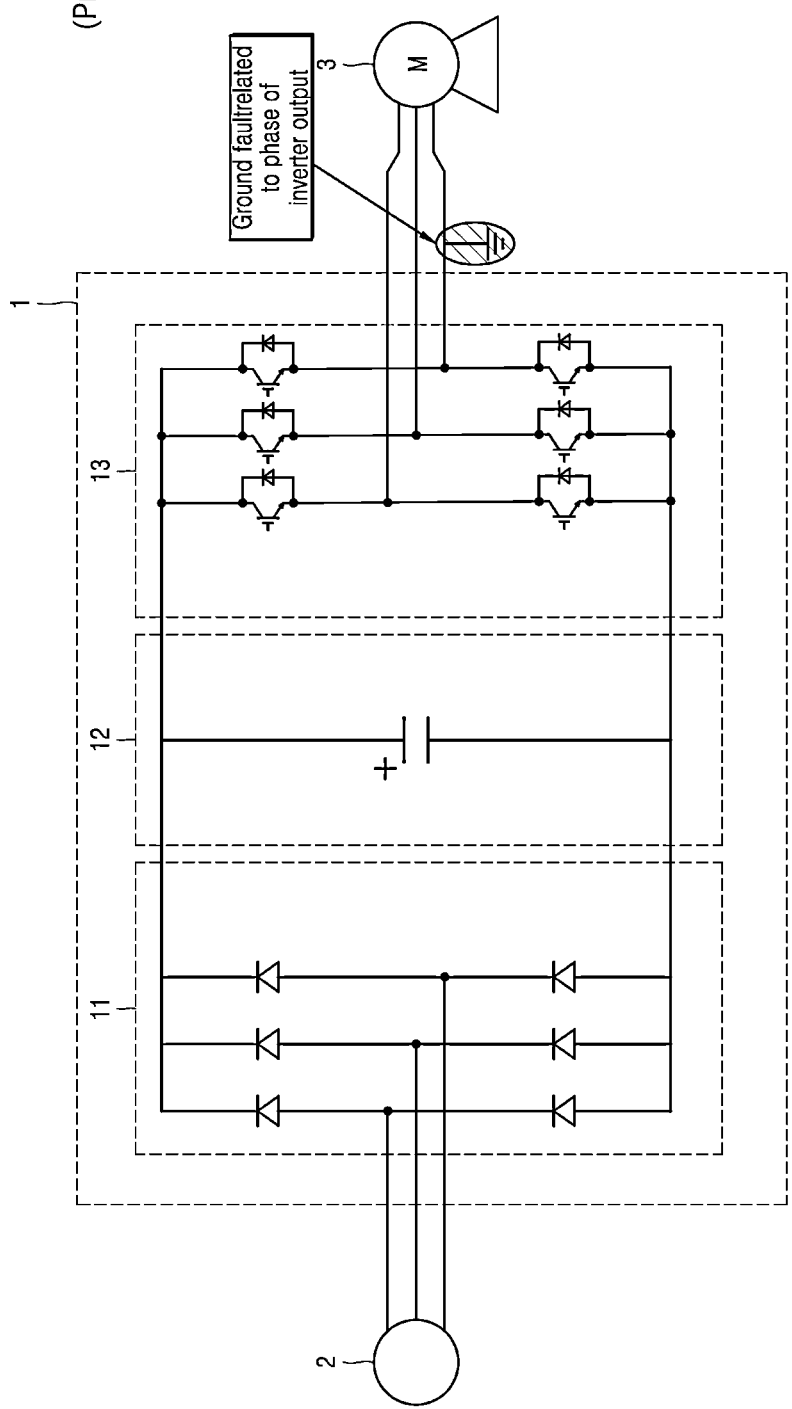
FIG. 4 is a configuration diagram of a general inverter according to a prior art.
Figure 5:
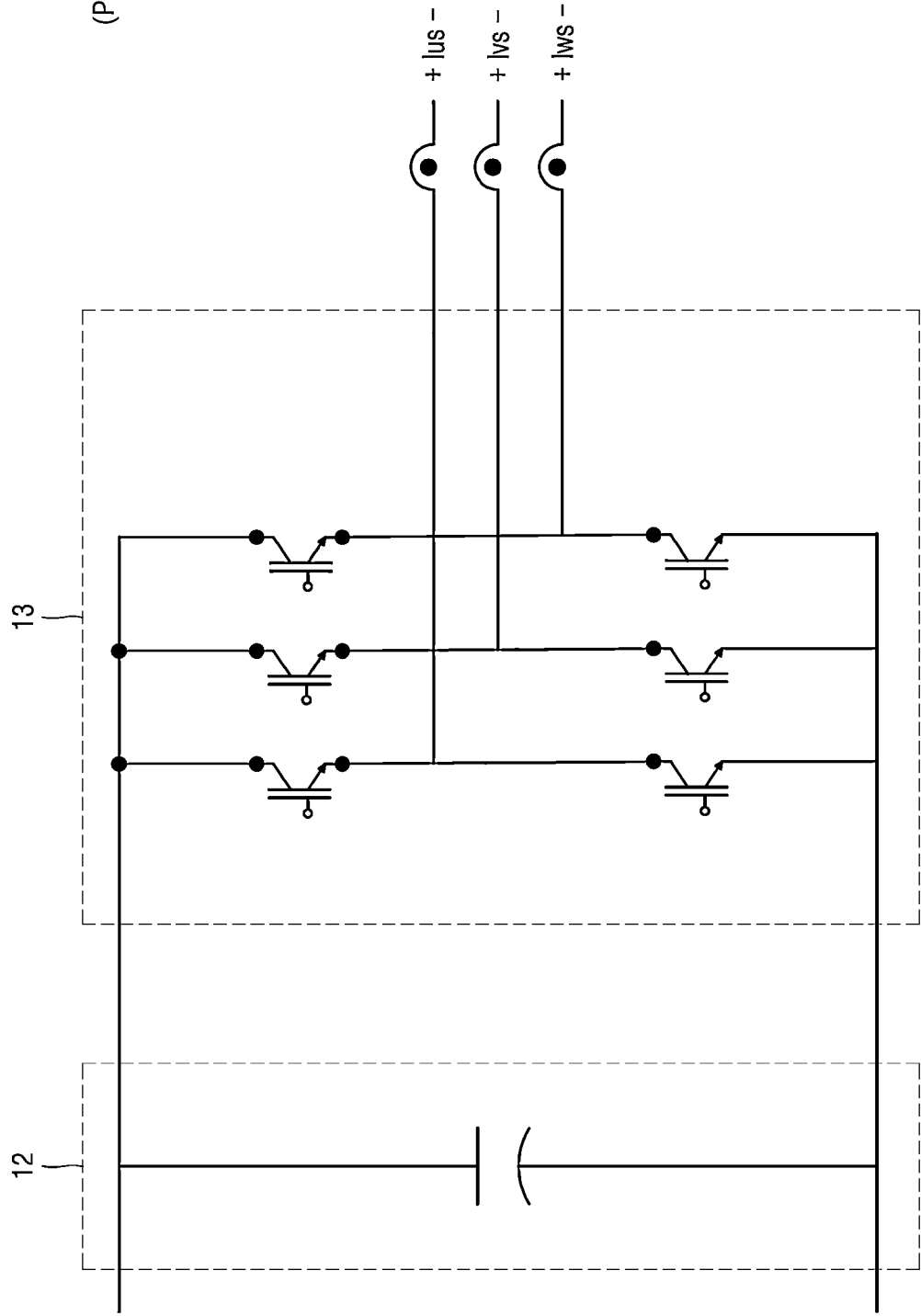
FIG. 5 is a configuration diagram of an inverter that detects output current using CT according to a prior art.
Figure 6:
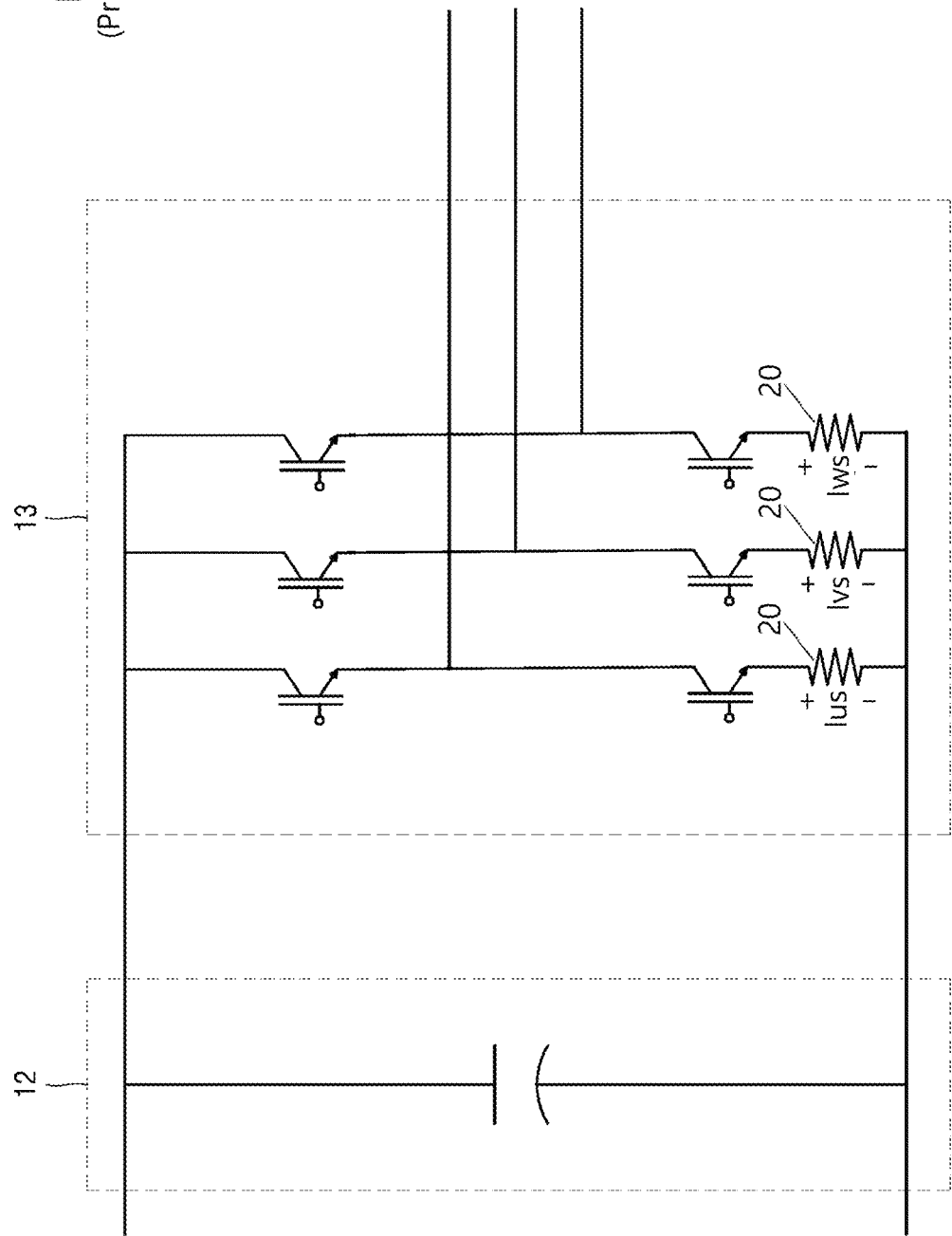
FIG. 6 is a configuration diagram of an inverter that detects output current using a leg-shunt resistor according to a prior art.
Figure 7:
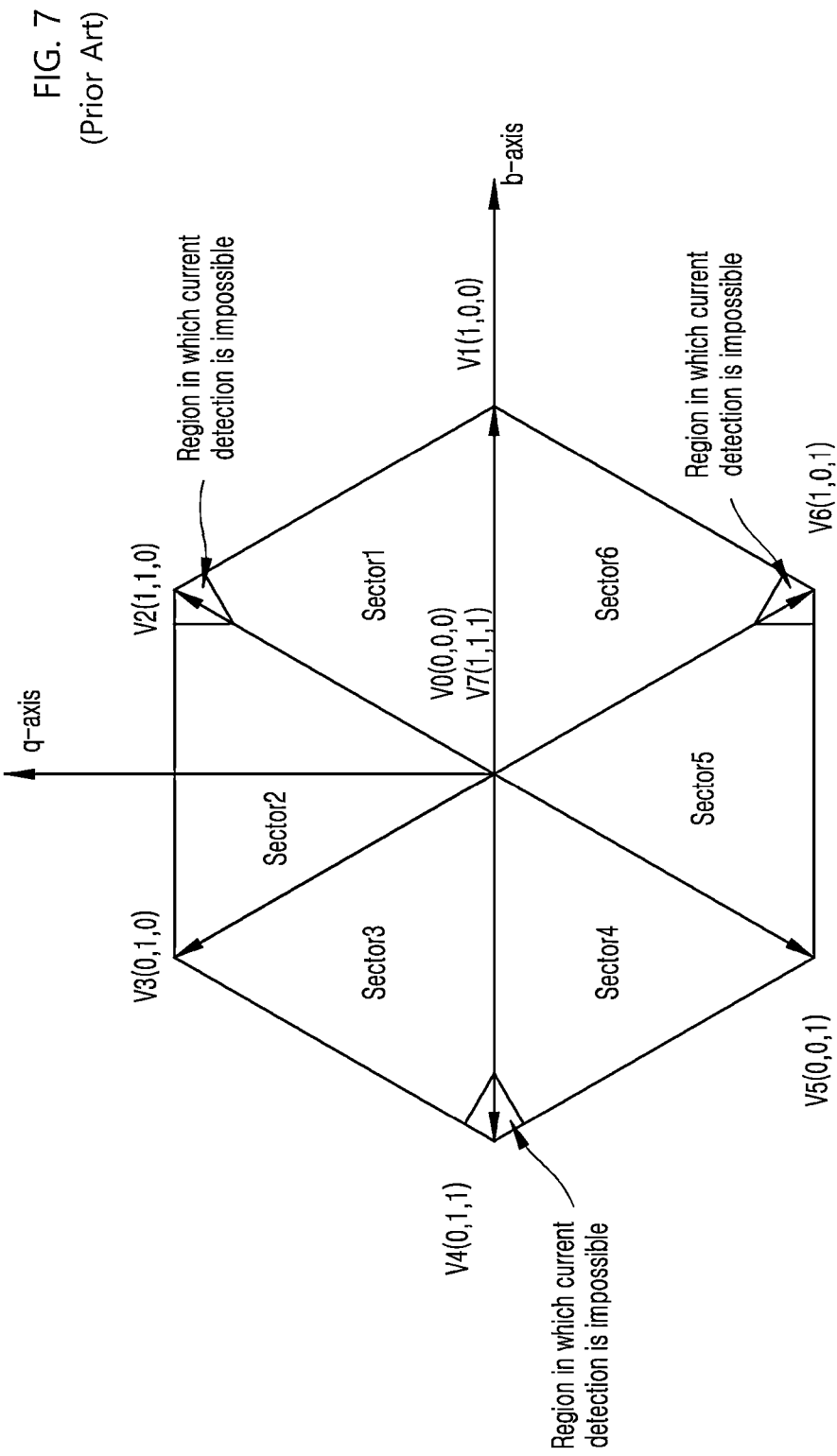
FIG. 7 is a diagram to illustrate a region in which output current detection is impossible based on a PWM state of the inverter.
Figure 8:
FIG. 8 is a configuration diagram of an inverter that may detect a ground fault of an output according to a prior art.
Figure 9A:
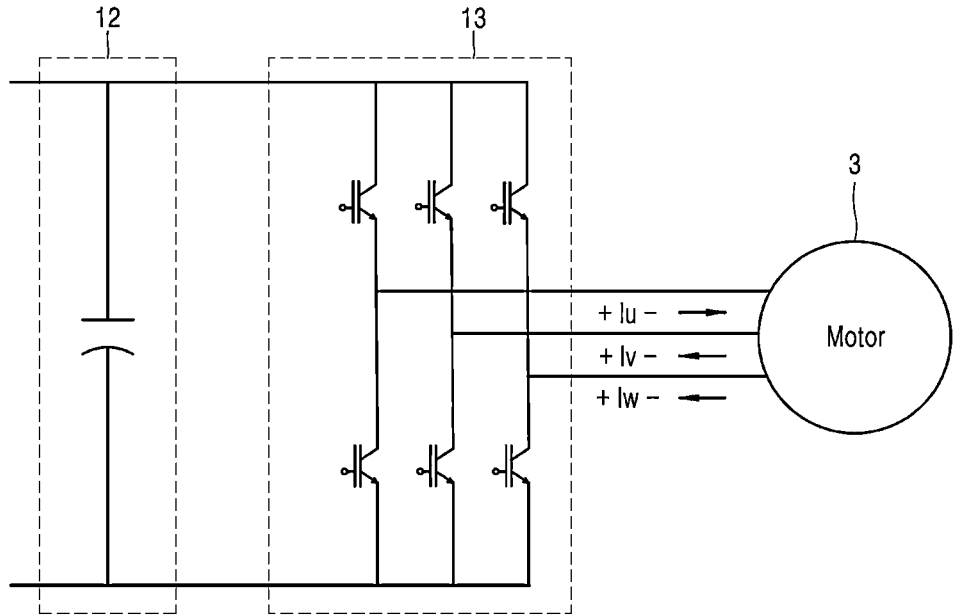
FIG. 9 is a block diagram showing output current paths in a normal state and in an event of an output ground fault in an inverter according to a prior art.
Figure 9B:
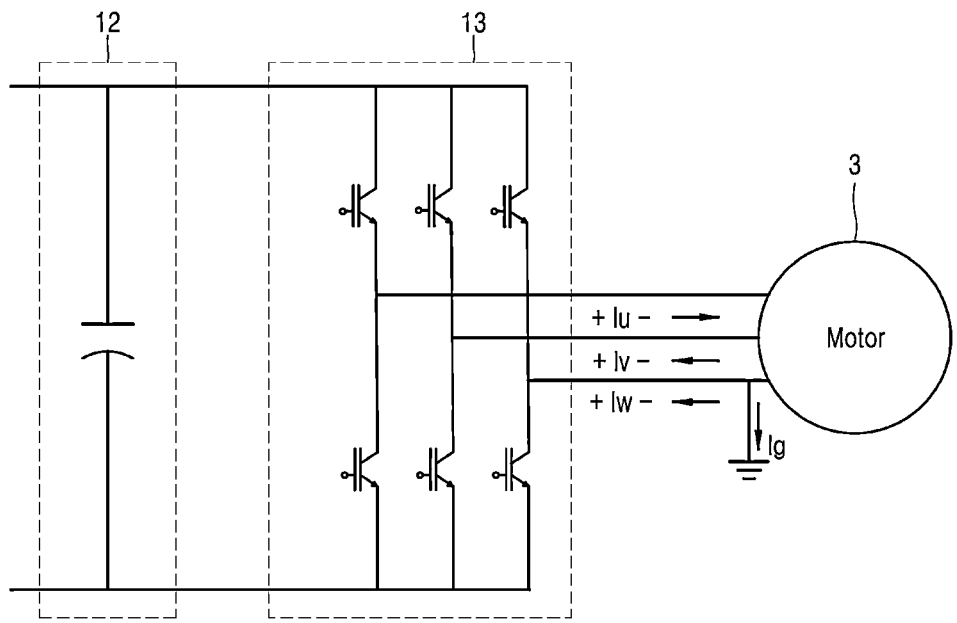

FIG. 3 is a flowchart of an inverter output ground fault detection method according to the present disclosure.

The inverter output ground fault detection method according to the present disclosure as shown in FIG. 3 includes a step S1 for detecting the current AD raw values, a step S2 for detecting the peak values of the absolute values, a step S3 for comparing the peak values of the absolute values with each other, a step S4 for determining the output ground fault level, a step S5 for increasing the count, a step S6 for determining the accumulated count compared to the output ground fault reference, and a step S7 for performing the protection operation.

In the step S1 of detecting the current AD raw values, the output ground fault detection module detects the current AD raw values measured from the leg-shunt resistors.

In the step S2 of detecting the peak values of the absolute values, the output ground fault detection module obtains the absolute values of the current AD raw values detected in the step S1 of detecting the current AD raw values, and then obtains the peak values thereof to generate the peak values of the absolute values.

The step S3 of comparing the peak values of the absolute values with each other includes comparing the peak values of the absolute values generated in the step S2 of detecting the peak values of the absolute values with each other to generate the difference values. The difference values as generated may include a UV difference value which is a difference value obtained by comparing the peak value of the U-phase current AD raw absolute value and the peak value of the V-phase current AD raw absolute value with each other, a VW difference value which is a difference value obtained by comparing the peak value of the V-phase current AD raw absolute value and the peak value of the W-phase current AD raw absolute value with each other, and a WU difference value which is a difference value obtained by comparing the peak value of the U-phase current AD raw absolute value and the peak value of the W-phase current AD raw absolute value with each other.

The step S4 for determining the output ground fault level includes comparing each of the UV difference values, that is, the VW difference value, the WU difference value, and the UV different value as generated in the step S3 of comparing the peak values of the absolute values with each other with the output ground fault level. In the step S4, the output ground fault detection module determines that an abnormality occurs in the V-phase among the current AD raw values of the 3 phases when each of the UV difference value and the VW difference value is greater than the output ground fault level and the WU difference value is smaller than the output ground fault level. Further, when the UV difference value is greater than the output ground fault level, the VW difference value is smaller than the output ground fault level, and the WU difference value is greater than the output ground fault level, the output ground fault detection module may determine that the abnormality occurs in the U-phase among the current AD raw values of the 3 phases. Further, when the UV difference value is smaller than the output ground fault level and each of the VW difference value and WU difference value is larger than the output ground fault level, the output ground fault detection module determines that there is an abnormality in the W-phase among the current AD raw values of the 3 phases.

In the step S5 of increasing the count, when it is determined based on the result of the step S4 for determining the output ground fault level, that at least one of the U-phase, the V-phase, and the W-phase is abnormal, the controller may increment at least one output ground fault count corresponding thereto. for example, the controller increases the U-phase output ground fault count when there is an abnormality in the U-phase. When there is an abnormality in the V-phase, the controller increases the V-phase output ground fault count. When there is an abnormality in the W-phase, the controller increases the W-phase output ground fault count.

The step S6 of determining the accumulated count compared to the output ground fault reference may include comparing each of the U-phase output ground fault count the V-phase output ground fault count and the W-phase output ground fault count as accumulated in the step S5 of increasing the count with the output ground fault reference and finally determine whether the output ground fault has occurred. For example, when the output ground fault reference is defined as 3 counts and the U-phase output ground fault count has reached 3 counts, the output ground fault detection module determines that the output ground fault has occurred in the U-phase. The output ground fault related to the remaining V-phase and W-phase may be determined in the same way.

In the step S7 of performing the protection operation, when the output ground fault detection module determines that the output ground fault has occurred in the step S6 for determining the accumulated count compared to the output ground fault reference, the output ground fault detection module prevents the inverter controller from inputting the PWM signal to the inverting unit and prevents power from being output from the inverting unit to the motor.

As described above, the present disclosure has been described with reference to the illustrated drawings. However, the present disclosure is not limited to the embodiments and drawings disclosed in the present specification. It is evident that various modifications may be made to the disclosure by those of ordinary skill in the art and within the scope of the technical idea of the present disclosure. In addition, although an effect of a configuration of the present disclosure has not been explicitly described above while illustrating the embodiments of the present disclosure, it is natural that an effect predictable from the configuration should also be appreciated. For example, the present disclosure has been described based on the inverter system. However, the controller may be included in the inverter and may be implemented with the inverter. Further, the present disclosure may be implemented using the controller used in the conventional inverter having the leg-shunt resistor.

What is claimed is:

1. An inverter system capable of detecting an output ground fault, the inverter system comprising:
    an inverting unit including two switching elements connected in series with each of legs thereof;
    each leg-shunt resistor connected in series with a switching element of a lower leg of the each of legs of the inverting unit; and
    a controller configured to control the inverting unit,
    wherein the controller is further configured to:
    compare peak values of absolute values of three current values of three-phases detected from the each leg-shunt resistor respectively with each other; and
    detect an output ground fault based on the comparing result, and
    wherein the controller includes:
        an output current detection module configured to detect the current values of the three-phases from the three leg-shunt resistors, respectively and detect the peak values of the absolute values thereof; and
        an output current comparing module configured to compare peak values of two phases among the three peak values of the absolute values of the three-phases with each other to generate three difference values.

2. The inverter system of claim 1, wherein the controller includes:
    an output ground fault detection module configured to:
    when one of the difference values is equal to or greater than an output ground fault level, increment an output ground fault count related to a phase corresponding to said one; and
    when the incremented count is equal to or greater than an output ground fault reference, determine that an output ground fault has occurred and thus stop an operation of the inverting unit.

3. The inverter system of claim 2, wherein the current values of the three-phases include a U-phase current value, a V-phase current value and a W-phase current value, wherein the difference values include:
  an UV difference value obtained by comparing the peak values of the absolute values of the U-phase current value and the V-phase current value with each other;
  an VW difference value obtained by comparing the peak values of the absolute values of the V-phase current value and the W-phase current value with each other; and
  a WU difference value obtained by comparing the peak values of the absolute values of the U-phase current value and the W-phase current value with each other.

4. The inverter system of claim 3, wherein the output ground fault detection module is configured to:
  when each of the UV difference value and the VW difference value is greater than the output ground fault level and the WU difference value is smaller than the output ground fault level, determine that an abnormality has occurred in the V-phase;
  when the UV difference value is greater than the output ground fault level, the VW difference value is smaller than the output ground fault level, and the WU difference value is greater than the output ground fault level, determine that an abnormality has occurred in the U-phase; and
  when the UV difference value is smaller than the output ground fault level and each of the VW difference value and the WU difference value is larger than the output ground fault level, determine that an abnormality has occurred in the W-phase.

5. A method for detecting an output ground fault using an inverter system, wherein the inverter system includes:
  an inverting unit including two switching elements connected in series with each of legs thereof, and
  each leg-shunt resistor connected in series with a switching element of a lower leg of the each of legs of the inverting unit; and
  a controller configured to control the inverting unit,
  wherein the method comprises:
    detecting, by the controller, three current values of three-phases from three leg-shunt resistors, respectively;
    detecting, by the controller, peak values of absolute values of the three current values;
    comparing, by the controller, peak values of two phases among the three peak values of the absolute values of the three-phases with each other to generate three difference values;
    when one of the difference values is equal to or greater than an output ground fault level, incrementing, by the controller, an output ground fault count related to a phase corresponding to said one; and
    when the incremented count is equal to or greater than an output ground fault reference, determining, by the controller, that an output ground fault has occurred and thus stopping, by the controller, an operation of the inverting unit.

6. The method of claim 5, wherein the current values of the three-phases include a U-phase current value, a V-phase current value and a W-phase current value,
wherein the difference values include:
  an UV difference value obtained by comparing the peak values of the absolute values of the U-phase current value and the V-phase current value with each other;
  an VW difference value obtained by comparing the peak values of the absolute values of the V-phase current value and the W-phase current value with each other; and
  a WU difference value obtained by comparing the peak values of the absolute values of the U-phase current value and the W-phase current value with each other.

7. The method of claim 6, wherein the incrementing of the output ground fault count and the determining that the output ground fault has occurred include:
  when each of the UV difference value and the VW difference value is greater than the output ground fault level and the WU difference value is smaller than the output ground fault level, determining, by the controller, that an abnormality has occurred in the V-phase;
  when the UV difference value is greater than the output ground fault level, the VW difference value is smaller than the output ground fault level, and the WU difference value is greater than the output ground fault level, determining, by the controller, that an abnormality has occurred in the U-phase; and
  when the UV difference value is smaller than the output ground fault level and each of the VW difference value and the WU difference value is larger than the output ground fault level, determining, by the controller, that an abnormality has occurred in the W-phase.

8. An inverter system capable of detecting an output ground fault, the inverter system comprising:
  an inverting unit including three legs, each leg of the three legs having a first switching element connected in series with a second switching element and a leg-shunt resistor, wherein the second switching element is disposed between the first switching element and the leg-shunt resistor for each leg of the three legs; and
  a controller configured to control the inverting unit,
  wherein the controller is further configured to:
    detect an output ground fault based on comparing peak values of absolute values of current values detected from the leg-shunt resistor for each leg of the three legs with each other; and
  wherein the controller includes:
    an output current detection module configured to detect the current values of the leg-shunt resistors for each leg of the three legs respectively and detect the peak values of the absolute values thereof; and
    an output current comparing module configured to compare the peak values between two phases among the three peak values of the absolute values of the leg-shunt resistors for each leg of the three legs with each other to generate three difference values.

* * * * *